(12) United States Patent
Yoshida et al.

(10) Patent No.: US 10,469,692 B2
(45) Date of Patent: Nov. 5, 2019

(54) SCANNING EXPOSURE DEVICE

(71) Applicants: V TECHNOLOGY CO., LTD., Kanagawa (JP); SHARP KABUSHIKI KAISHA, Osaka (JP)

(72) Inventors: Yuji Yoshida, Kanagawa (JP); Mineyuki Matsumoto, Kanagawa (JP); Toshinari Arai, Kanagawa (JP); Shigeki Tanaka, Osaka (JP); Keita Katayose, Osaka (JP); Hideyuki Suzuki, Osaka (JP); Makoto Kanbe, Osaka (JP)

(73) Assignees: V TECHNOLOGY CO., LTD., Kanagawa (JP); SHARP KABUSHIKI KAISHA, Osaka (JP)

(*) Notice: Subject to any disclaimer, the term of this patent is extended or adjusted under 35 U.S.C. 154(b) by 78 days.

(21) Appl. No.: 15/551,378

(22) PCT Filed: Feb. 17, 2016

(86) PCT No.: PCT/JP2016/054518
§ 371 (c)(1),
(2) Date: Aug. 16, 2017

(87) PCT Pub. No.: WO2016/133103
PCT Pub. Date: Aug. 25, 2016

(65) Prior Publication Data
US 2018/0041656 A1 Feb. 8, 2018

(30) Foreign Application Priority Data
Feb. 18, 2015 (JP) ................. 2015-030025

(51) Int. Cl.
*H04N 1/04* (2006.01)
*H04N 1/028* (2006.01)
(Continued)

(52) U.S. Cl.
CPC ............. *H04N 1/0282* (2013.01); *G03F 1/88* (2013.01); *H04N 1/401* (2013.01); *H04N 1/40056* (2013.01)

(58) Field of Classification Search
CPC .. H04N 1/0282; H04N 1/40056; H04N 1/401; G03F 1/88
(Continued)

(56) References Cited

U.S. PATENT DOCUMENTS 7,635,930 B2 * 12/2009 Ohishi ................... G03B 27/58
310/12.01
2002/0057422 A1 * 5/2002 Arakawa ............. G03F 7/70525
355/30
(Continued)

FOREIGN PATENT DOCUMENTS

JP 2005-150708 A 6/2005
JP 2008-10643 A 1/2008
(Continued)

OTHER PUBLICATIONS

International Search Report for corresponding International Application No. PCT/JP2016/054518, dated May 17, 2016 (5 pages).
(Continued)

*Primary Examiner* — Cheukfan Lee
(74) *Attorney, Agent, or Firm* — Osha Liang LLP

(57) ABSTRACT

A scanning exposure device includes a stage that supports a substrate, wherein a space is provided between a stage surface and the substrate; a light source unit that radiates light to a light irradiation area that extends in one direction above the substrate; and a scanning device that moves one or both of the stage and the light source unit relatively in a scanning direction that intersects the one direction. The scanning device is provided with an acceleration zone from a position in which the stage and the light source unit are at a standstill to a position in which the substrate supported by the stage enters the light irradiation area. The stage com-
(Continued)

prises a light shielding member that covers the space between the stage surface and the substrate at an end part of the stage.

10 Claims, 4 Drawing Sheets

(51) Int. Cl.
    *H04N 1/40*     (2006.01)
    *H04N 1/401*     (2006.01)
    *G03F 1/88*     (2012.01)

(58) Field of Classification Search
    USPC ................ 355/67, 71; 358/475, 509, 474
    See application file for complete search history.

(56) References Cited

U.S. PATENT DOCUMENTS

2008/0001482 A1    1/2008    Ohishi
2014/0332698 A1*  11/2014  Sato ...................... G02F 1/1303
                                                                          250/492.1
2018/0044795 A1*   2/2018  Harumoto ............... B05C 11/00
2018/0253012 A1*   9/2018  Matsuo ............. H01L 21/31133
2019/0086697 A1*   3/2019  Tomimaru ........ G02F 1/133788

FOREIGN PATENT DOCUMENTS

| | | | |
|---|---|---|---|
| JP | 2009-75303 A | 4/2009 |
| JP | 2009-295950 A | 12/2009 |
| JP | 2014-174287 A | 9/2014 |
| JP | 2014-174352 A | 9/2014 |

OTHER PUBLICATIONS

Written Opinion for corresponding International Application No. PCT/JP2016/054518, dated May 17, 2016 (9 pages).
Office Action issued in corresponding Chinese Patent Application No. 201680010209.3 dated Jun. 4, 2018 (16 pages).

* cited by examiner

SCANNING EXPOSURE DEVICE

TECHNICAL FIELD

The present invention relates to a scanning exposure device.

BACKGROUND ART

A scanning exposure device is a device that exposes a substrate with light while relatively moving a light source unit and a stage supporting the substrate, and used, for example, for mask pattern exposure (see PTL 1) and exposure for photo-alignment (see PTL 2). The scanning exposure device includes the light source unit that is extended in one direction above a plane of the substrate, and, with a direction that intersects the extended direction of the light source unit being a scanning direction, the light source unit performs uniform exposure on a light irradiation area limited thereby, and moreover performs uniform exposure on a relatively large substrate by moving the substrate relatively to the light irradiation area.

CITATION LIST

Patent Literature

[PTL 1] Japanese Patent Application Publication No. 2009-295950
[PTL 2] Japanese Patent Application Publication No. 2014-174352

Efforts to increase the illuminance of the light source and the scanning speed in the scanning exposure device are in progress for the purpose of improving takt time in exposure processing (or to improve the throughput). To this end, in order to perform uniform exposure, the scanning speed must be kept constant during the period after the substrate enters the light irradiation area of the light source unit until the substrate exits from the light irradiation area, and in order to increase the scanning speed, an accelerating zone (run-up zone) must be provided until the stage or the light source unit attains a constant high scanning speed from a standstill. When the substrate enters the light irradiation area, the radiated light from the light source must be stable, and therefore the light source is lighted up in advance before the substrate enters the light irradiation area.

In the meantime, a space is provided between a stage surface and the substrate supported on the stage for example by pin support in order to prevent the influence of static electricity or the like on the stage surface. In the case, it has been observed that light with high illuminance radiated from the light source unit in the accelerating zone is reflected for example by a floor face to become stray light, and the stray light comes into the space between the stage surface and the substrate, so that the substrate is exposed with light from the substrate back surface side. If such a phenomenon happens, the substrate is exposed to the stray light from the substrate back surface side near an end part of the transparent substrate in addition to the originally intended exposure from the substrate front surface side, which may cause unevenness of exposure.

As countermeasures against the stray light, the light source unit may be provided with a shutter, but particles are generated as the shutter is opened/closed and thermal deformation of the shutter is caused by short distance radiation of light (such as ultraviolet radiation) from a light source, and successful countermeasures against the stray light have not been provided in the present state of the art.

SUMMARY OF INVENTION

One or more embodiments of the present invention prevent unevenness of exposure near the end part of the substrate in the process of increasing the illuminance of the light source and the scanning speed for the purpose of improving the takt time for the scanning exposure device and the throughput.

A scanning exposure device according to one or more embodiments of the present invention includes the following configurations.

A scanning exposure device includes: a stage that supports a substrate, with a space being provided between a stage surface and the substrate; a light source unit that radiates light to a light irradiation area, the light irradiation area being extended in one direction above the substrate; and a scanning device that moves one or both of the stage and the light source unit relatively in a scanning direction that intersects the one direction, wherein the scanning device is provided with an acceleration zone from the position in which the stage and the light source unit are at a standstill to the position in which the substrate supported by the stage enters the light irradiation area, and the stage includes a light shielding member that covers the space between the stage surface and the substrate at an end part of the stage.

In the scanning exposure device according to one or more embodiments of the present invention having the features, the light shielding member provided at the end part of the stage shields stray light resulting from light radiated from the light source unit in the accelerating zone that would otherwise come into the space between the stage surface and the substrate, so that the end part of the substrate can be prevented from being exposed to light from the substrate back surface side. In this way, unevenness of exposure near the end part of the substrate can be prevented and uniform scanning exposure can be performed at the entire substrate.

DETAILED DESCRIPTION OF EMBODIMENTS

Figure 1:
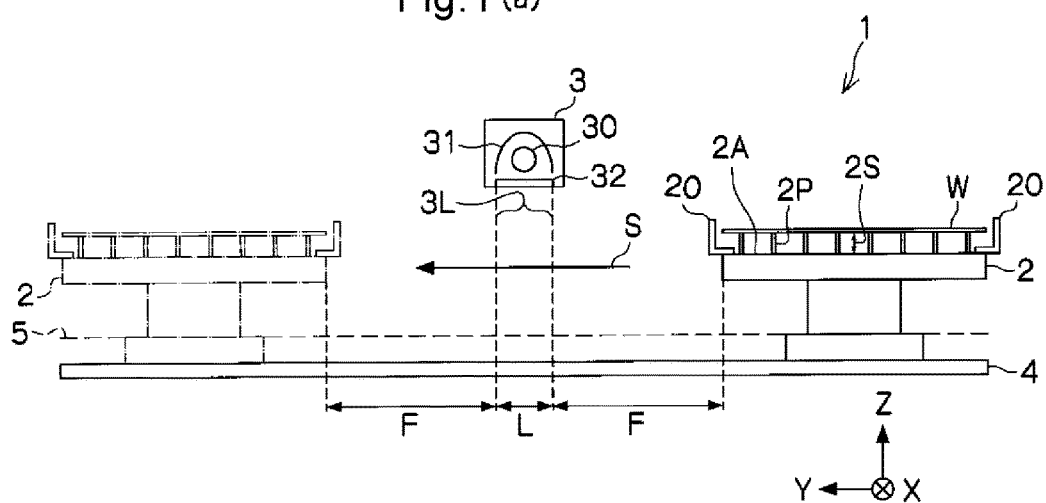
FIG. 1 is a view for illustrating a scanning exposure device according to one or more embodiments of the present invention (in which FIG. 1(a) is a side view and FIG. 1(b) is a plan view).
Figure 1:
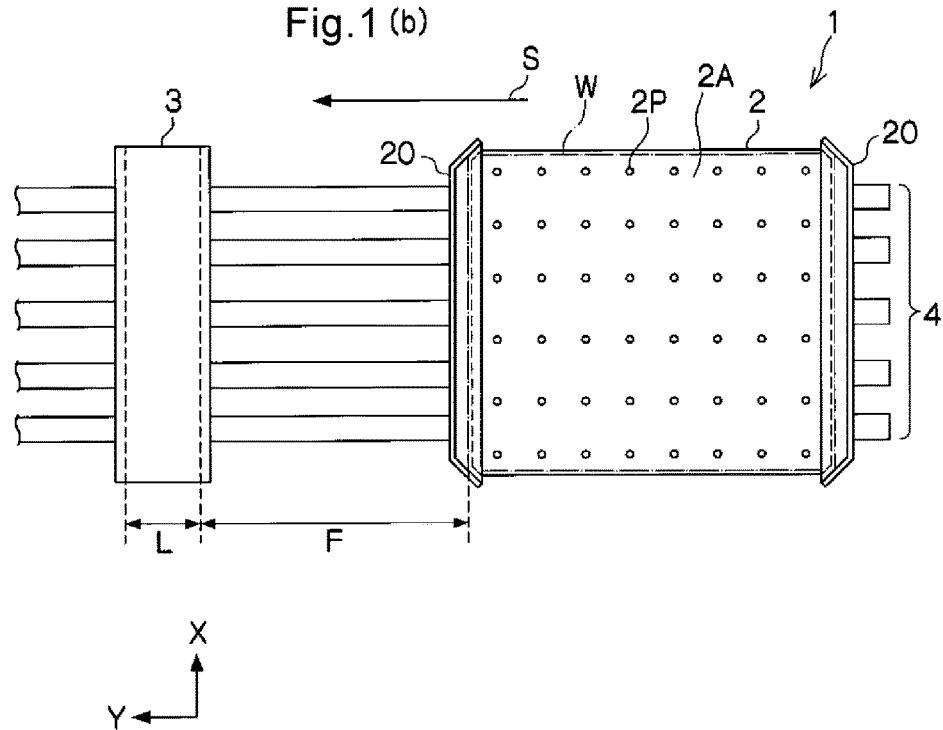

Now, embodiments of the present invention will be described in conjunction with accompanying drawings. FIG. 1 illustrates a scanning exposure device according to one or more embodiments of the present invention (in which FIG. 1(a) is a side view and FIG. 1(b) is a plan view). The scanning exposure device 1 includes a stage 2, a light source unit 3, and a scanning device 4. In the drawings, directions orthogonal to each other in a plane along a substrate W are X- and Y-directions, while a direction orthogonal to the plane along the substrate W is a Z-direction.

The stage 2 supports the substrate W with a space 2S provided between a stage surface 2A and the substrate. In the illustrated example, the space 2S is formed as the substrate W is supported at the top ends of pins 2P placed upright on the stage surface 2A, while, alternatively, the space 2S may be formed by pneumatic support or the like.

The light source unit 3 radiates light to a light irradiation area 3L extended in one direction (X-direction in the figures) above the substrate W. The illustrated example includes a light source 30, a reflection member 31 that reflects light emitted from the light source 30, and a polarizing plate 32 such as a wire grid. The light irradiation area 3L is extended in the X-direction and has a width L limited in the Y-direction.

The scanning device 4 moves one or both of the stage 2 and the light source unit 3 relatively in a scanning direction S (Y-direction in the figures) that intersects one direction (X-direction). In the illustrated example, the light source unit 3 is fixed and the stage 2 is moved in the scanning direction S, while, conversely, the stage 2 may be fixed and the light source unit 3 may be moved in the scanning direction S.

The scanning device 4 is provided with an accelerating zone F between the position in which the stage 2 and the light source unit 3 are at a standstill and the position in which the substrate W supported by the stage 2 enters the light irradiation area 3L. The accelerating zone F is necessary to obtain a constant scanning speed during the period after one end of the substrate W in the Y-direction enters the light irradiation area 3L until the other end of the substrate W in the Y-direction exits from the light irradiation area 3L, and since there is a limit to acceleration increase, the accelerating zone F must be prolonged in order to set a higher scanning speed.

The stage 2 is provided with a light shielding member 20 that covers the space 2S between the stage surface 2A and the substrate W at the end part of the stage 2. In the illustrated example, the light shielding member 20 is provided at each of the end parts of the stage 2 that intersect the scanning direction S, but the light shielding member 20 may be provided only at the end part on the side entering the light irradiation area 3L of these end parts that intersect the scanning direction S. The light shielding member 20 may also be provided at each of the end parts of the stage 2 along the scanning direction S, so that the entire periphery of the stage 2 may be surrounded by the light shielding members 20.

Figure 2:
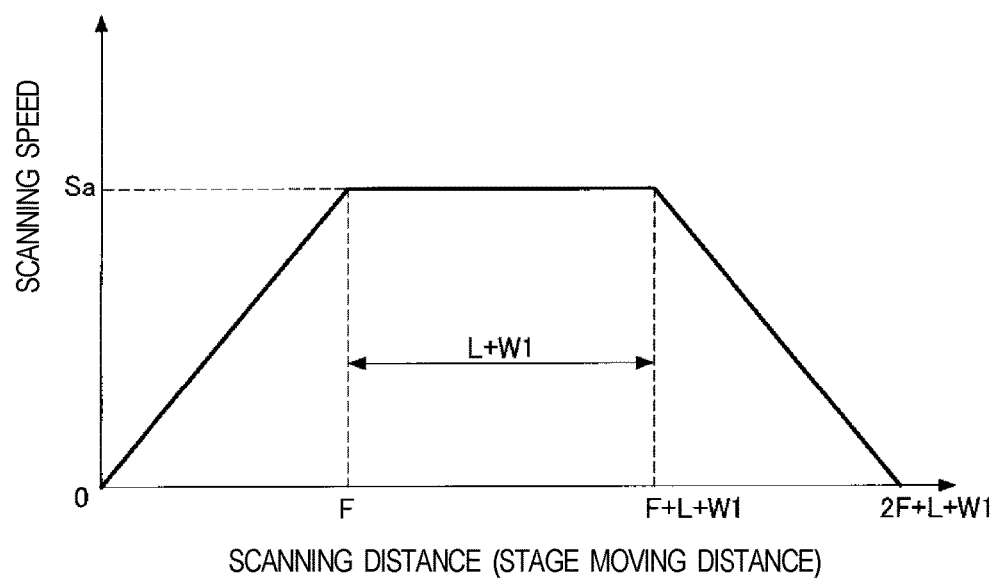
FIG. 2 is a view for illustrating exemplary operation of the scanning exposure device according to one or more embodiments of the present invention.

FIG. 2 illustrates exemplary operation of the scanning exposure device 1 when scanning exposure is carried out while the stage 2 is moved (and the light source unit 3 is at a standstill). Here, the substrate W is carried into the stage 2 in a position apart from the light irradiation area 3L of the light source unit 3 by the accelerating zone F, and the scanning speed (the moving speed of the stage) is raised to a set speed Sa while the stage 2 is moved by the length of the accelerating zone F.

When the substrate W enters the light irradiation area 3L of the light source unit 3, the scanning speed is kept constant for the moving distance (L+W1) until the entire substrate W having the length W1 in the scanning direction S passes the light irradiation area 3L having the width L, and during the period, the substrate W is subjected to uniform scanning exposure. Then, after the entire substrate W passes the light irradiation area 3L, the speed is lowered gradually, the stage 2 is stopped in the position in which the substrate W is away from the light irradiation area 3L by the accelerating zone F, and the substrate W is taken out.

Here, while the stage 2 moves in the accelerating zone F, the light source 30 of the light source unit 3 has already been lighted up, and therefore light emitted from the light source 30 is reflected by a floor face 5 or the like, so that stray light R is radiated upon the substrate W. Without the light shielding member 20 according to one or more embodiments of the present invention, the stray light R would come into the space 2S between the stage surface 2A and the substrate W as shown in FIG. 3(b), and the transparent substrate W is exposed to the light from the substrate back surface side. Light emitted from the light source 30 and reflected by the floor face 5 or the like may pass near the end part of the substrate W and may be reflected by structures around the stage 2 multiple times, so that the substrate W may be exposed to light from above. If the phenomenon happens, unwanted additional exposure is caused near the end part of the substrate W or the center of the substrate W, and unevenness of exposure is partly caused on the substrate W, though uniform the exposure could be in the regular light irradiation area 3L.

Figure 3A:
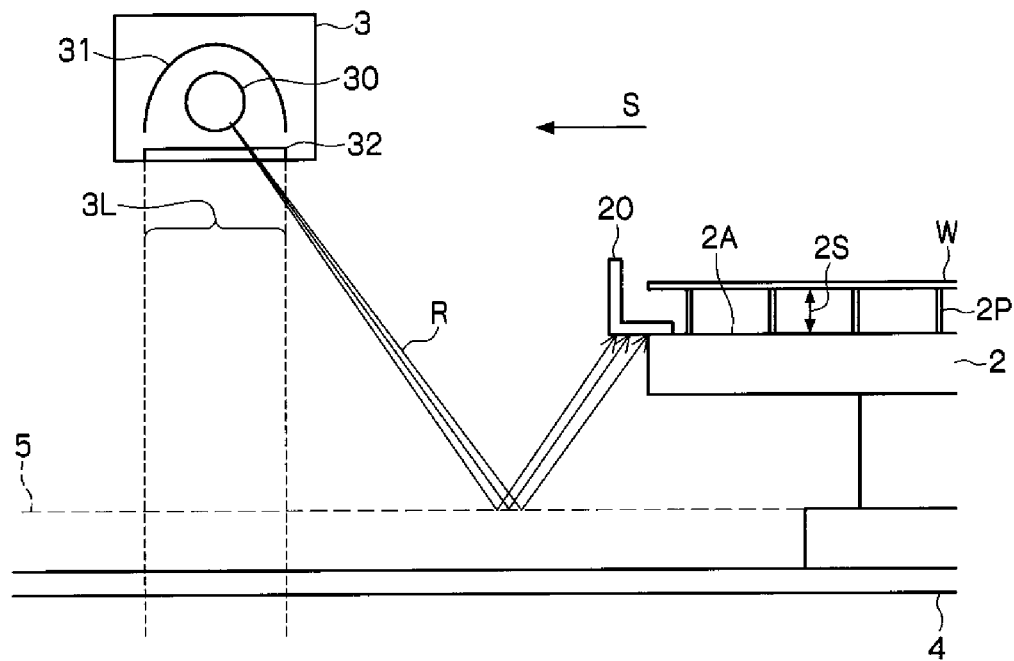
FIG. 3 is a view for illustrating the function of the scanning exposure device according to one or more embodiments of the present invention (in which FIG. 3(a) illustrates the function according to one or more embodiments of the present invention and FIG. 3(b) illustrates a conventional case).
Figure 3B:
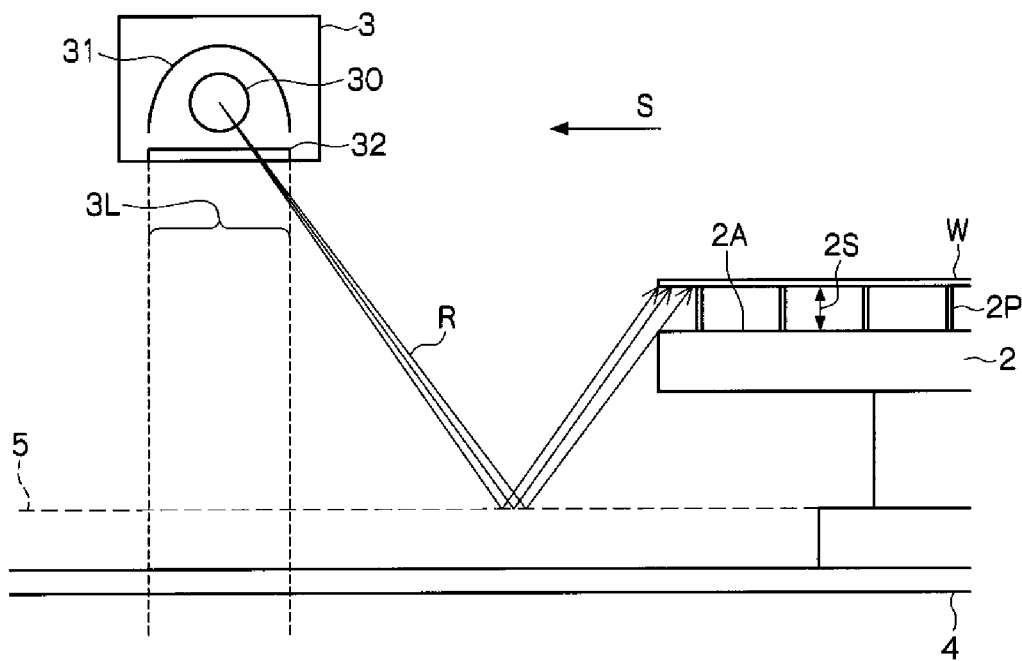

In contrast, as shown in FIG. 3(a), according to one or more embodiment of the present invention, the light shielding member 20 is provided at the end part of the stage 2, and the space 2S between the stage surface 2A and the substrate W is covered with the light shielding member 20, so that the stray light R generated as shown can be prevented from coming into the space 2S. Furthermore, generation of stray light that passes near the end part of the substrate W and that is reflected by structures around the stage 2 multiple times and subjects the substrate W to light-exposure from the above can be prevented. In this way, the substrate W can be subjected to scanning exposure only in the regular light irradiation area 3L, and the unevenness of exposure can be avoided.

The scanning exposure device 1 can be used in photoalignment processing in which the light source unit 3 radiates an ultraviolet ray and a photo alignment material layer is formed on the substrate W, and a homogeneous alignment film can effectively be formed on the substrate W. More specifically, the light shielding member 20 provided at the end part of the stage 2 can reduce the reaction of the photo alignment material layer before the substrate W enters the light irradiation area 3L, so that the device can be applied to a material with a higher sensitivity without changing the light source unit 3. Not only the reaction in the accelerating zone F but also a partial reaction at the time of carrying in the substrate W onto the stage 2 can be reduced.

With the scanning exposure device 1 according to one or more embodiment of the present invention, since the accelerating zone F can be increased while performing uniform exposure, the illuminance of the light source unit 3 can be increased and exposure can be carried out at higher scanning speed, so that the takt time and the throughput can be improved.

When the light source unit 3 continues to be on and a plurality of substrates W are sequentially exposed to stably emitted light, uniform exposure can be carried out at each of the substrate W, and in the case, since a light source shutter is not necessary, one or more embodiments of the invention do not have particles being generated as the shutter is opened/closed or thermal deformation of the light source shutter itself.

Figure 4A:
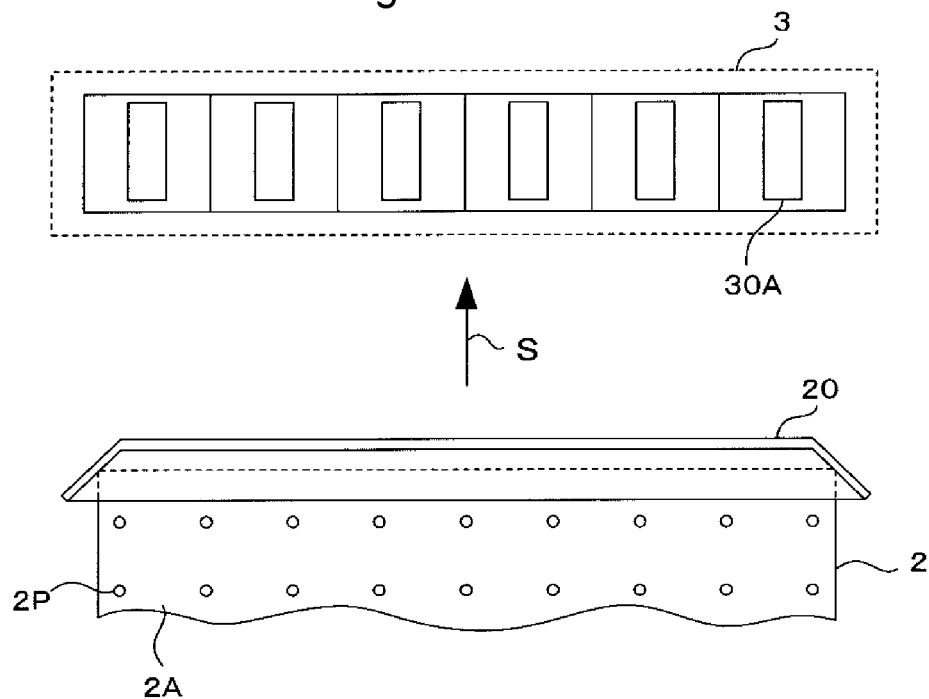
FIG. 4 is a view for illustrating an example of a light source unit in the scanning exposure device according to one or more embodiments of the present invention.
Figure 4B:
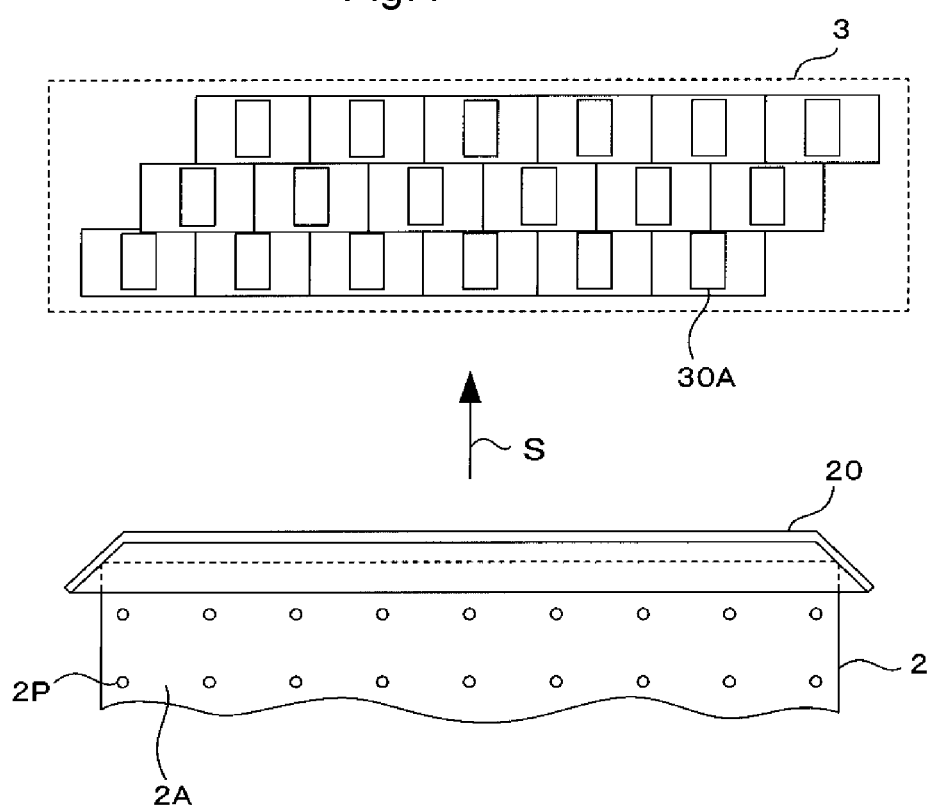

The light source unit 3 may be any unit that radiates light to the light irradiation area 3L extended in one direction (in the direction that intersects the scanning direction S) above the substrate W, and as shown in FIG. 4, a plurality of light sources 30A extended in the scanning direction S may be arranged in the direction that intersects the scanning direction S to form the light irradiation area 3L instead of the unit having the light source 30 itself extended in the direction that intersects the scanning direction S. In the case, a light source unit 3 having a single array of light sources 30A as shown in FIG. 4(a) or a light source unit 3 having a plurality of arrays of light sources 30A in a zigzag arrangement as shown in FIG. 4(b) may be employed.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 Scanning exposure device
2 Stage
2A Stage surface
2P Pin
2S Space
20 Light shielding member
3 Light source unit
3L Light irradiation area
30, 30A Light source
31 Reflection member
32 Polarizing plate
4 Scanning device
5 Floor face
S Scanning direction
W Substrate
R Stray light

The invention claimed is:

1. A scanning exposure device, comprising:
   a stage that supports a substrate, wherein a space is provided between a stage surface and the substrate;
   a light source unit that radiates light to a light irradiation area that extends in one direction above the substrate; and
   a scanning mechanism that comprises a rail and moves one or both of the stage and the light source unit relatively on the rail in a scanning direction that intersects the one direction,
   wherein the scanning mechanism has an acceleration zone from a position in which the stage and the light source unit are at a standstill to a position in which the substrate supported by the stage enters the light irradiation area, and
   wherein the stage comprises a light shielding member that covers the space between the stage surface and the substrate at an end part of the stage.

2. The scanning exposure device according to claim 1, wherein the stage supports the substrate at top ends of a plurality of pins placed upright at the stage surface.

3. The scanning exposure device according to claim 2, wherein the light source unit radiates an ultraviolet ray.

4. The scanning exposure device according to claim 3, wherein a photo alignment material layer is formed on the substrate.

5. The scanning exposure device according to claim 1, wherein the light source unit radiates an ultraviolet ray.

6. The scanning exposure device according to claim 5, wherein a photo alignment material layer is formed on the substrate.

7. A scanning exposure device, comprising:
   a stage that supports a substrate, wherein a space is provided between a stage surface and the substrate;
   a light source unit that radiates light to a light irradiation area that extends in one direction above the substrate; and
   a scanning mechanism that comprises a rail and moves one or both of the stage and the light source unit relatively on the rail in a scanning direction that intersects the one direction,
   wherein the scanning mechanism has an acceleration zone from a position in which the stage and the light source unit are at a standstill to a position in which the substrate supported by the stage enters the light irradiation area,
   wherein the stage comprises a light shielding member that covers the space between the stage surface and the substrate at an end part of the stage, and
   wherein the light source unit radiates an ultraviolet ray.

8. The scanning exposure device according to claim 7, wherein the stage supports the substrate at top ends of a plurality of pins placed upright at the stage surface.

9. A scanning exposure device, comprising:
   a stage that supports a substrate, wherein a space is provided between a stage surface and the substrate;
   a light source unit that radiates light to a light irradiation area that extends in one direction above the substrate; and
   a scanning mechanism that comprises a rail and moves one or both of the stage and the light source unit relatively on the rail in a scanning direction that intersects the one direction,
   wherein the scanning mechanism has an acceleration zone from a position in which the stage and the light source unit are at a standstill to a position in which the substrate supported by the stage enters the light irradiation area,
   wherein the stage comprises a light shielding member that covers the space between the stage surface and the substrate at an end part of the stage,
   wherein the light source unit radiates an ultraviolet ray, and
   wherein a photo alignment material layer is formed on the substrate.

10. The scanning exposure device according to claim 9, wherein the stage supports the substrate at top ends of a plurality of pins placed upright at the stage surface.

* * * * *